United States Patent
Goyal et al.

(10) Patent No.: US 8,495,758 B2
(45) Date of Patent: Jul. 23, 2013

(54) METHOD AND APPARATUS FOR PROVIDING SCAN CHAIN SECURITY

(75) Inventors: Suresh Goyal, Warren, NJ (US); Michele Portolan, Blandshardstown (IE); Bradford Van Treuren, Lambertville, NJ (US)

(73) Assignee: Alcatel Lucent, Paris (FR)

( * ) Notice: Subject to any disclaimer, the term of this patent is extended or adjusted under 35 U.S.C. 154(b) by 345 days.

(21) Appl. No.: 12/818,707

(22) Filed: Jun. 18, 2010

(65) Prior Publication Data

US 2011/0314514 A1    Dec. 22, 2011

(51) Int. Cl.
*G06F 1/26*     (2006.01)
*G06F 11/00*    (2006.01)
*G08B 13/00*    (2006.01)
*G08B 21/00*    (2006.01)
*G08B 29/00*    (2006.01)

(52) U.S. Cl.
USPC ............................................. 726/34

(58) Field of Classification Search
USPC .......................................... 726/34
See application file for complete search history.

(56) References Cited

U.S. PATENT DOCUMENTS

| | | | | |
|---|---|---|---|---|
| 6,018,776 | A * | 1/2000 | Wise et al. | 710/7 |
| 6,108,007 | A   | 8/2000 | Shochet | |
| 6,289,480 | B1  | 9/2001 | Qureshi | |
| 7,308,656 | B1 * | 12/2007 | Roberts et al. | 716/103 |
| 2010/0199077 | A1 * | 8/2010 | Case et al. | 713/1 |

FOREIGN PATENT DOCUMENTS
EP    1 443 338 A1    8/2004

OTHER PUBLICATIONS

F. Novak, A. Biasizzo, "On Security Issues of Scan Design," paper, 8 pages, 2nd IEEE European Board Test Workshop, May 24-25, 2006, Chilworth, Southampton, UK.
F. Novak, A. Biasizzo, "On Security Issues of Scan Design," presentation, 20 slides, 2nd IEEE European Board Test Workshop, May 24-25, 2006, Chilworth, Southampton, UK.
The International Search Report and the Written Opinion of the International Searching Authority, or the Declaration in PCT/US2011/040152, Alcatel-Lucent USA Inc., Applicant, mailed Oct. 20, 2011, 13 pages.

* cited by examiner

*Primary Examiner* — Kambiz Zand
*Assistant Examiner* — Stephen Sanders
(74) *Attorney, Agent, or Firm* — Wall & Tong, LLP

(57) ABSTRACT

A scan chain security capability is provided herein. The scan chain security capability enables secure control over normal use of a scan chain of a system, e.g., for purposes such as testing prior to deployment or sale of the system, in-field testing after deployment or sale of the system, in-field modification of the system, and the like. The scan chain security capability enables secure control over normal use of a scan chain by enabling control over interruption of a scan chain and re-establishment of an interrupted scan chain. A scan chain security component is configured for removing an open-circuit condition from the scan chain in response to a control signal. The control signal may be generated in response to validation of a security key, in response to successful completion of a challenge-based authentication process, or in response to any other suitable validation or authentication. The scan chain security component also may be configured for creating an open-circuit condition in the scan chain in response to a second control signal. The second control signal may be a scan register value received via the scan chain.

20 Claims, 12 Drawing Sheets

700

METHOD AND APPARATUS FOR PROVIDING SCAN CHAIN SECURITY

FIELD OF THE INVENTION

The invention relates generally to scan chains for Joint Test Action Group (JTAG) testing and, more specifically but not exclusively, to security of scan chains for JTAG testing.

BACKGROUND

Design for Test (DfT) techniques like Joint Test Action Group (JTAG) are a fundamental help to the testing of complex Integrated Circuits (ICs) and System-on-Chips (SoCs), because they allow a simple and effective means of accessing, as well as reading and modifying, the device internal components. This access is provided via scan chains. Disadvantageously, however, this access that is beneficial during testing can cause many problems for security after the product is sold/deployed. Namely, this same access can be used for malicious reasons, to modify the product, tamper with the product, reverse-engineer the product, or to perform other malicious activities.

As a result, attempts have been made to secure access to ICs and SoCs, such that the access to ICs and SoCs that is used for testing cannot be exploited after the associated products are sold/deployed.

A typical solution for preventing exploitation of the scan chain of a system after testing is to make a hard modification to the system, such that scan chain access to the system becomes impossible. For example, the Test Access Port (TAP) of the system may be burned or removed in some manner. Disadvantageously, however, this solution has multiple drawbacks. First, the JTAG infrastructure itself remains on the system and, thus, an attacker still may be able to access it (e.g., by insertion of probes). The JTAG wires are relatively easy to identify on the board, and the results can be immediate. A famous example of this procedure is unlocking of the first generation Apple iPhone, realized by a student in only a few tries. Second, the DfT infrastructure becomes a "dead weight" on the board and cannot be used anymore, even though many applications (e.g., in-field and online testing) could greatly benefit from such access.

Furthermore, in Field Programmable Gate Array (FPGA)—Complex Programmable Logic Device (CPLD) products, two different approaches are used to disable JTAG access to the configuration area of their devices. A first approach is to use a fuse on a device which, when burnt, disables access to the configuration area of the device. Disadvantageously, however, once the fuse is burnt, no JTAG access is possible until the burnt part is replaced. A second approach is to use a battery backup to support secure storage (e.g., Electrically Erasable Programmable Read-Only Memory (EEPROM), FLASH, or similar storage) containing a key that is used to decrypt the input bitstream. Disadvantageously, however, while this approach enables subsequent JTAG access, the real estate on the device that is needed for the battery backup can be problematic in many applications.

SUMMARY

Various deficiencies in the prior art are addressed by embodiments for providing scan chain security. A scan chain security capability enables secure control over normal use of a scan chain of a system, e.g., for purposes such as testing prior to deployment or sale of the system, in-field testing after deployment or sale of the system, in-field modification of the system, and the like. The scan chain security capability enables secure control over normal use of a scan chain by enabling control over interruption of a scan chain and re-establishment of an interrupted scan chain. A scan chain security component is configured for removing an open-circuit condition from the scan chain in response to a control signal. The control signal may be generated in response to validation of a security key, in response to successful completion of a challenge-based authentication process, or in response to any other suitable validation or authentication. The scan chain security component also may be configured for creating an open-circuit condition in the scan chain in response to a second control signal. The second control signal may be a scan register value received via the scan chain.

BRIEF DESCRIPTION OF THE DRAWINGS

The teachings herein can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

A scan chain security capability is depicted and described herein. The scan chain security capability enables secure control over normal use of a scan chain of a system, e.g., for purposes such as testing prior to deployment or sale of the system, in-field testing after deployment or sale of the system, in-field modification of the system, and the like, as well as various combinations thereof. The scan chain security capability enables secure control over normal use of a scan chain by enabling control over interruption of the scan chain (for preventing normal use of the scan chain) and enabling control over re-establishment of the scan chain after interruption of the scan chain (for enabling normal use of the scan chain). In this manner, the scan chain security capability enables controllable locking and unlocking of the scan chain at any time and for any purpose. In this manner, locking of the scan chain using the scan chain security capability is reversible, which is in stark contrast most of to the existing scan chain security methods in which any attempted securing of the scan chain is permanent (e.g., burning one or more components which provide scan chain access) and, thus, normal use of the scan chain after execution of the scan chain security methods is impossible.

In one embodiment, the controlled interruption of the scan chain and the controlled re-establishment of the scan chain may be provided using a scan chain security component that is configured for creating an open-circuit condition in order to prevent normal use of the scan chain and for removing the open-circuit condition in order to re-enable normal use of the scan chain.

In one embodiment, the scan chain security component may be disposed within the scan chain. An exemplary use of such a scan chain security component within a scan chain is depicted and described with respect to FIG. 1A.

In one embodiment, the scan chain security component may be disposed within a Test Access Interface (TAI) configured for providing access to the scan chain, such as an Institute of Electrical and Electronics Engineers (IEEE) 1149.1 Test Access Port (TAP). An exemplary use of such a scan chain security component in a TAI is depicted and described with respect to FIG. 1B.

Figure 1A:
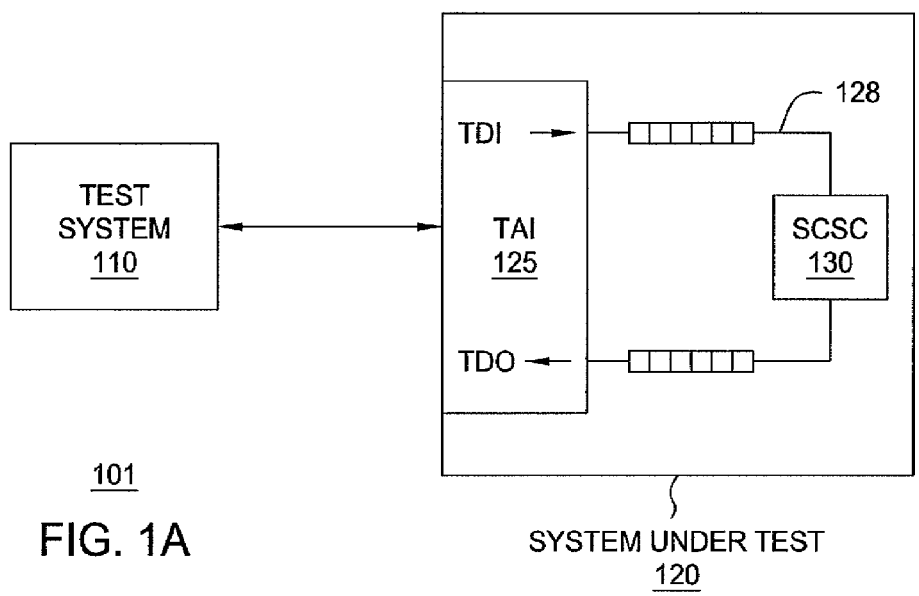
FIGS. 1A and 1B depict high-level block diagrams of an exemplary system testing environment including a testing system and a system under test.
Figure 1B:
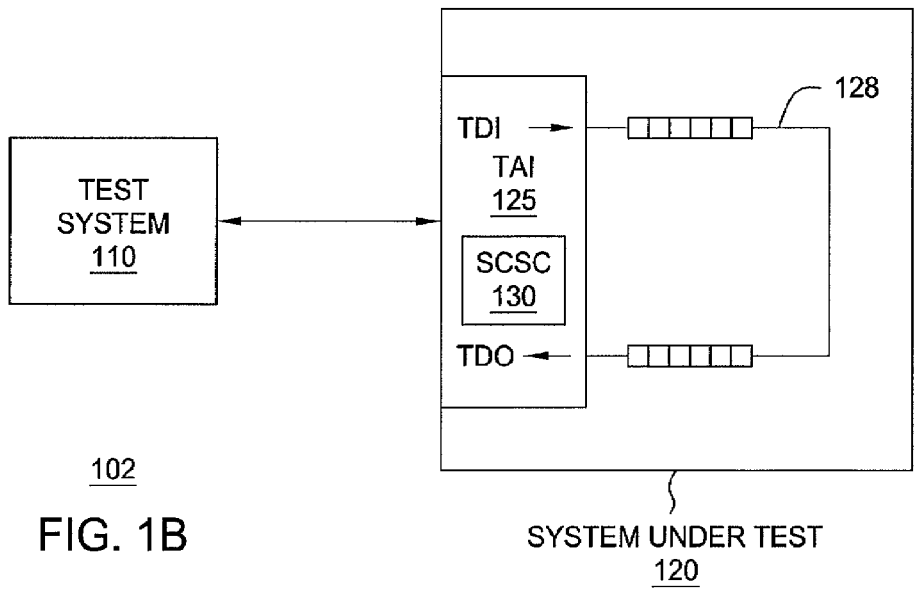

FIGS. 1A and 1B depict high-level block diagrams of an exemplary system testing environment including a testing system and a system under test.

As depicted in FIGS. 1A and 1B, system testing environments 101 and 102 each include a testing system (TS) 110 and a system under test (SUT) 120.

The TS 110 may be any system suitable for testing SUT 120. The TS 110 is configured for testing SUT 120. The TS 110 may perform any testing of SUT 120, e.g., testing one or more individual components of SUT 120, one or more combinations of components of SUT 120, one or more interconnections between components of SUT 120, one or more system level functions of SUT 120, and the like, as well as various combinations thereof. The TS 110 may perform any of the functions typically associated with testing a system under test, such as executing test procedures, providing input data to the system under test, receiving output data from the system under test, processing output data received from the system under test for determining system testing results, and like functions, as well as various combinations thereof. The design and use of TS 110 for testing a system under test is described in additional detail hereinbelow.

The SUT 120 may be any system which may be tested using TS 110. The SUT 120 may include any component(s), at least a portion of which may be tested, individually and/or in combination, by TS 110. The TS 120 may include one or more scan chains, having one or more sets of associated input and output access pins, providing access to the component(s) to be tested by SUT 120. The manner in which a scan chain(s) may be utilized in SUT 120 for testing SUT 120 will be appreciated by one skilled in the art. For example, SUT 120 may include one or more boards, testing of which may be performed using one or more scan chains having associated input and output access pins which may be used for applying input testing signals to SUT 120 and collecting output testing signals from SUT 120.

As depicted in FIGS. 1A and 1B, TS 110 accesses SUT 120 via a test access interface (TAI) 125.

The TAI 125 may be implemented using any suitable test access interface, which may depend on one or more of the TS 110, the SUT 120, the type of testing to be performed, and the like, as well as various combinations thereof.

In one embodiment, the TAI 125 may be implemented as Joint Test Action Group (JTAG) Test Access Port (TAP) as standardized in the IEEE 1149.1 standard, which is incorporated by reference herein in its entirety.

The IEEE 1149.1 TAP supports the following set of signals for use in testing: Test Data In (TDI), Test Data Out (TDO), Test Mode Select (TMS), Test Clock (TCK), and, optionally, Test Reset Signal (TRST). The TDI and TDO pins of SUT 120 are interconnected in a boundary scan chain 128 via which TS 110 may perform testing on SUT 120.

The IEEE 1149.1 TAP also supports a TAP Controller, an Instruction Register, a Bypass Register, and, optionally, one or more additional elements (e.g., Data Registers, decode modules, and the like).

The TAI 125 may include any other suitable test access interface.

It will be appreciated by one skilled in the art that TS 110, TAI 125, and SUT 120 may be implemented in any manner suitable for providing features of various embodiments depicted and described herein.

As depicted in FIGS. 1A and 1B, the testing environments 101 and 102 each include a scan chain security component (SCSC) 130.

As depicted in FIG. 1A, in the system testing environment 101, the SCSC 130 configured for creating an open circuit in order to interrupt the scan chain and closing the open circuit in order to un-interrupt the scan chain may be placed within the scan chain 128. The TDI input is coupled to a series of cells at the input of the scan chain 128, which are in turn coupled to SCSC 130, which is in turn coupled to a series of cells at the output of the scan chain 128, which are in turn coupled to the TDO output. The use of SCSC 130 in this configuration may be better understood by way of reference to FIGS. 2-7.

As depicted in FIG. 1B, in the system testing environment 102, the SCSC 130 configured for creating an open circuit in order to interrupt the scan chain and closing the open circuit in order to un-interrupt the scan chain may be placed within TAI 125. The use of SCSC 130 in this configuration may be better understood by way of reference to FIGS. 2-3 and 8.

As described herein, SCSC 130 is configured for creating and removing an open-circuit condition within scan chain 128. Thus, SCSC 130 may be implemented in any manner suitable for creating and removing an open-circuit condition within scan chain 128.

Figure 3:
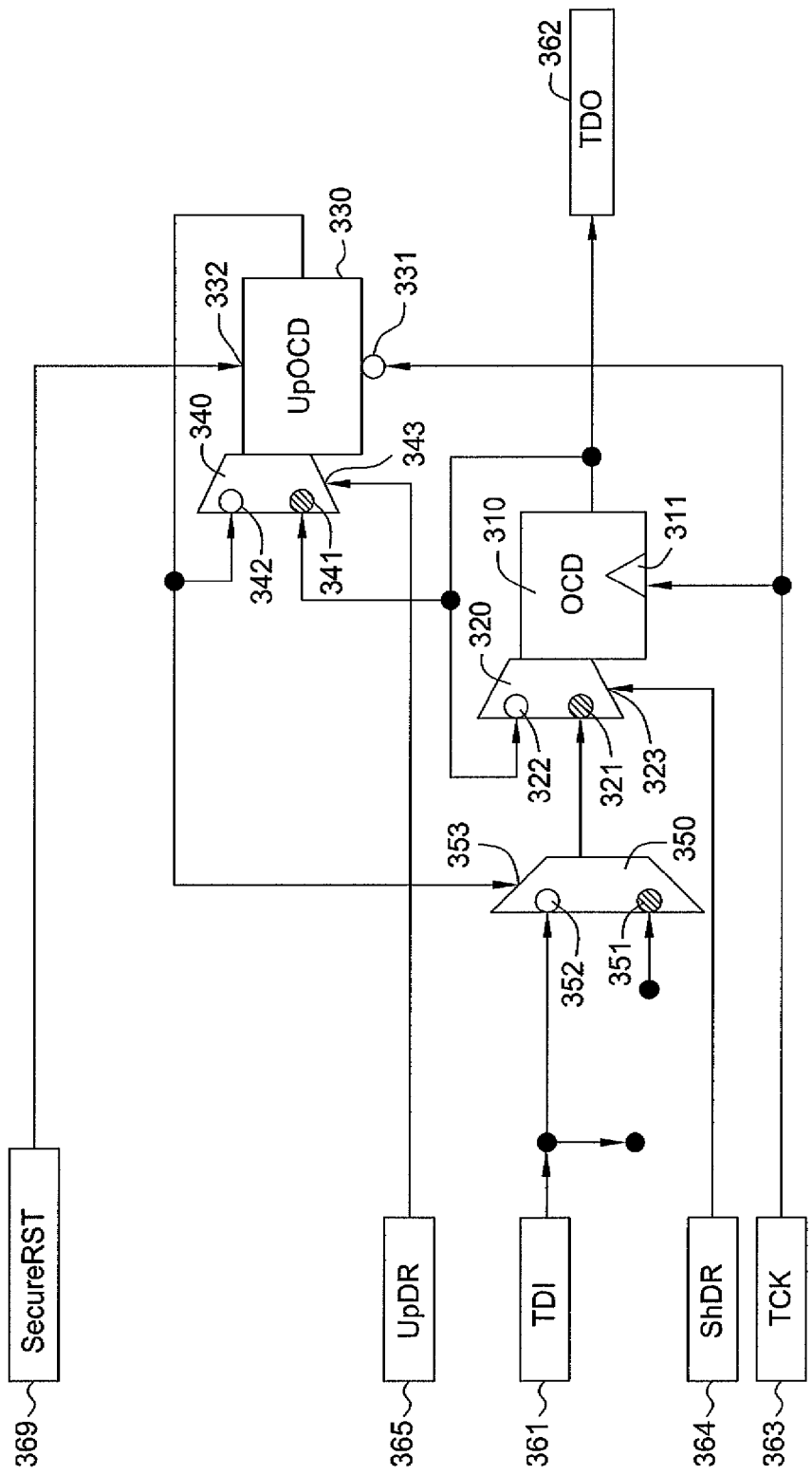
FIG. 3 depicts one embodiment of an OCD cell configured for use in controlling scan chain security.

In one embodiment, SCSC 130 is implemented as an Open-Circuit Deadlock (OCD) cell, an embodiment of which is depicted and described with respect to FIG. 3.

Figure 2:
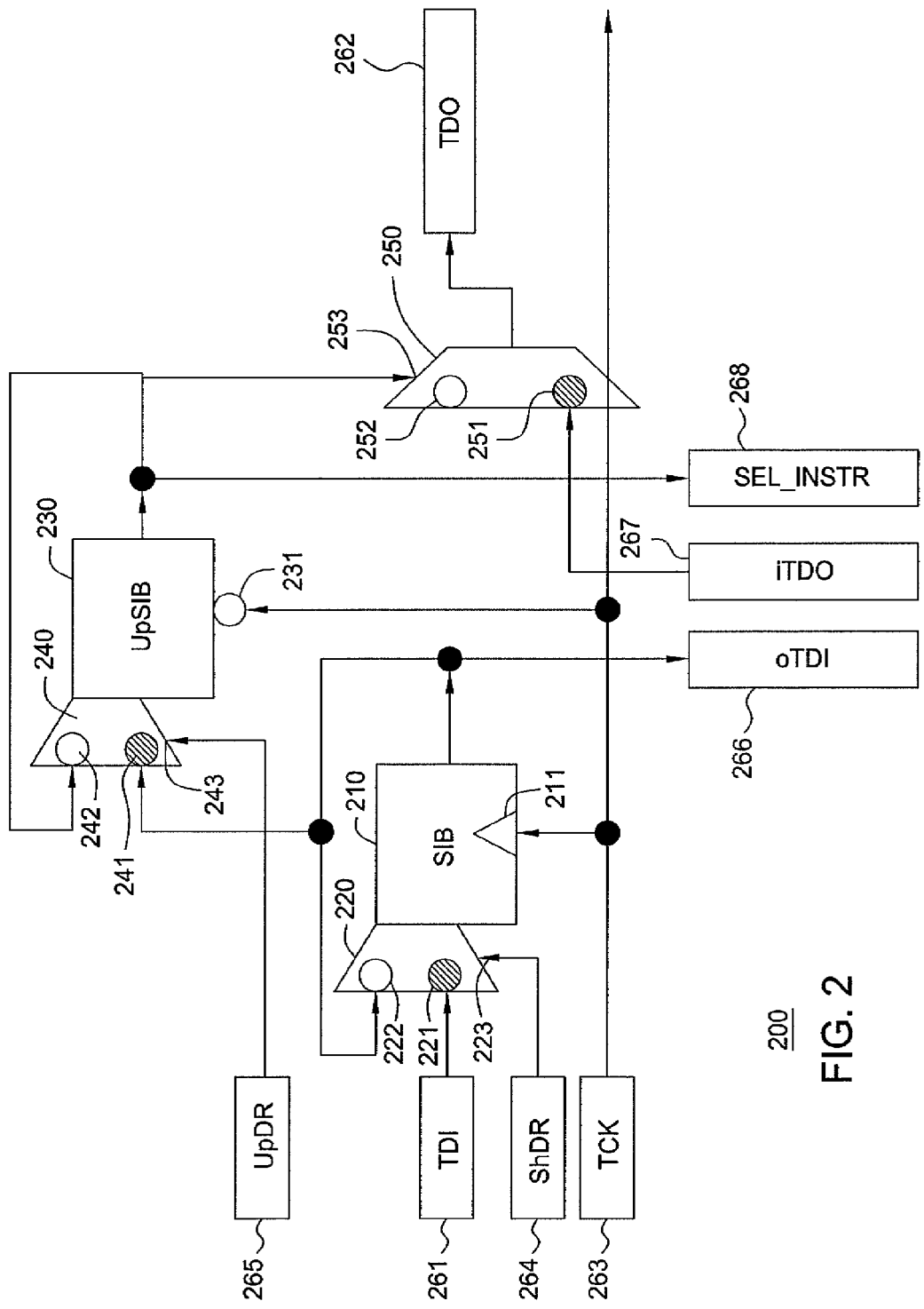
FIG. 2 depicts a high-level block diagram of the SIB cell proposed by the IEEE P1687 working group, which is configured for use in enabling hierarchical scan chain access.

In one embodiment, the OCD cell may be similar to the Segment Insertion Bit (SIB) cell proposed by the IEEE P1687 working group, which is depicted and described with respect to FIG. 2.

Although depicted and described with respect to an exemplary system testing environment in which scan chain security may be provided, it will be appreciated that the scan chain security capability may be provided within any other suitable type of environment having a scan chain.

FIG. 2 depicts a high-level block diagram of the SIB cell proposed by the IEEE P1687 working group, which is configured for use in enabling hierarchical scan chain access.

The SIB cell 200 is configured to support a first hierarchical level of the scan chain (via a TDI input and a TDO output) and a second hierarchical level of the scan chain (via a oTDI input and a iTDO output).

The SIB cell 200 includes a Select Instrument Bit (SIB) register 210 having a SIB input MUX 220 associated therewith, an Update SIB (UpSIB) register 230 having an UpSIB input MUX 240 associated therewith, and an output MUX 250.

The SIB input MUX 220 associated with the SIB register 210 controls input to SIB register 210. The SIB input MUX 220 includes two input ports 221 and 222. The SIB input MUX 220 accepts as inputs: (a) at input port 221, the TDI input 261 (e.g., from a previous component in the scan chain, omitted for purposes of clarity), and (2) at input port 222, the output of SIB register 210. The SIB input MUX 220 is controlled by an ShDR control signal 264, which is applied to a control port 223 of the SIB input MUX 220. When the ShDR control signal 264 is "1", SIB input MUX 220 passes the signal from the TDI input 261 into SIB register 210 via input port 221. When the ShDR control signal 264 is "0", SIB input MUX 220 passes the signal from the output of SIB register 210 into SIB register 210 via input port 222.

The SIB register 210 accepts input from the output of SIB input MUX 220. The SIB register 210 is controlled by a clock signal (denoted as TCK signal 263) applied to a clock port 211 of SIB register 210. The output of the SIB register 210 is coupled to each of the following: an input to the SIB input MUX 220 (illustratively, input 222), an input to the UpSIB input MUX 240 (illustratively, input 241), an input to the output MUX 250 (illustratively, input port 252), and the oTDI port 266 (which provides access to components of the second hierarchical level for propagating signals to and within the second hierarchical level when the second hierarchical level of the scan chain is activated).

The UpSIB input MUX 240 associated with the UpSIB register 230 controls input to UpSIB register 230. The UpSIB input MUX 240 includes two input ports 241 and 242. The UpSIB input MUX 240 accepts as inputs: (a) at input port 241, the output from the SIB register 210, and (2) at input port 242, the output from the UpSIB register 230. The UpSIB input MUX 240 is controlled by the UpDR control signal 265 applied to a control port 243 of the UpSIB input MUX 240. When the UpDR control signal 265 is "1", UpSIB input MUX 240 passes the signal from the output of SIB register 210 into UpSIB register 230 (via input port 241). When the UpDR control signal 265 is "0", UpSIB input MUX 240 passes the signal from the output of UpSIB register 230 into UpSIB register 230 (via input port 242).

The UpSIB register 230 accepts input from the output of UpSIB input MUX 240. The UpSIB register 230 is controlled by a clock signal (denoted as TCK signal 263) applied to a clock port 231 of UpSIB register 230. The output of the UpSIB register 230 is coupled to each of the following: an input to the UpSIB input MUX 240 (illustratively, input 242), a control port 253 of the output MUX 250, and a Select_Instr signaling path 268.

The output MUX 250 includes two input ports 251 and 252. The output MUX 250 accepts as inputs: (1) at input port 251, input from the lower hierarchical level via the iTDO port 267 (which provides access from components of the second hierarchical level of the scan chain to the first hierarchical level of the scan chain when the second hierarchical level of the scan chain is activated), and (2) at input port 252, the output from the SIB register 210. The output of output MUX 250 is coupled to the TDO output 262 of SIB cell 200 (for propagation to a subsequent component in the first hierarchical level of the scan chain). The output of output MUX 250 is determined by a control signal applied to a control port 253 of the output MUX 250. The output of the UpSIB register 230 is coupled to the control port 253 of output MUX 250.

As depicted in FIG. 2, the value of UpSIB register 230 determines whether the second hierarchical level is selected (i.e., part of the scan chain) or deselected (i.e., not part of the scan chain). When the second hierarchical level is deselected (i.e., the value of UpSIB register 230 is "0") the output MUX 250 passes the output of the SIB register 210 to the TDO output 262 of SIB cell 200, and the value from the iTDO port 267 is ignored. When the second hierarchical level is selected (i.e., the value of UpSIB register 230 is "1"), output MUX 250 passes the signal from the second hierarchical level (i.e., from the iTDO port 267) to the TDO output 262 of SIB cell 200.

As described herein, in one embodiment the OCD cell may be similar to the Segment Insertion Bit (SIB) cell proposed by the IEEE P1687 working group, as depicted and described with respect to FIG. 2. An exemplary embodiment of the OCD cell is depicted and described with respect to FIG. 3.

FIG. 3 depicts one embodiment of an OCD cell configured for use in controlling scan chain security.

As may be seen from a comparison of FIG. 2 and FIG. 3, the OCD cell 300 of FIG. 3 is similar to the SIB cell 200 of FIG. 2 in at least some respects.

As described herein, the OCD cell 300 is associated with a scan chain and is configured to secure normal use of the scan chain with which the OCD cell 300 is associated (e.g., via placement of the OCD cell 300 within the scan chain, via placement of the OCD cell 300 within the test access interface via which the scan chain is accessed, or any other suitable placement of OCD cell 300).

The OCD cell 300 is configured to create an open-circuit condition within the scan chain in response to receiving a control signal, where the creation of the open-circuit condition prevents normal use of the scan chain. The control signal used for creating the open-circuit condition in the scan chain may be any suitable control signal. In one embodiment, the control signal used for creating the open-circuit condition in the scan chain is a scan register value. In one such embodiment, the scan register value is received via the scan chain.

The OCD cell 300 is configured to remove an open-circuit condition from the scan chain in response to receiving a control signal, where the removal of the open-circuit condition re-enables normal use of the scan chain.

The OCD cell 300 includes an OCD register 310 having an OCD input MUX 320 associated therewith, an Update OCD (UpOCD) register 330 having an UpOCD input MUX 340 associated therewith, and an input MUX 350.

The OCD input MUX 320 associated with OCD register 310 controls input to OCD register 310. The OCD input MUX 320 includes two input ports 321 and 322. The OCD input MUX 320 accepts as inputs: (a) at input port 321, the output of input MUX 350, and (2) at input port 322, the output of OCD register 310. The OCD input MUX 320 is controlled by an ShDR control signal 364, which is applied to a control port 323 of the OCD input MUX 320. When the ShDR control signal 364 is "1", OCD input MUX 320 passes the signal from the output of input MUX 350 into OCD register 310 via input port 321. When the ShDR control signal 364 is "0", OCD input MUX 320 passes the signal from the output of OCD register 310 into OCD register 310 via input port 322.

The OCD register 310 accepts input from the output of OCD input MUX 320. The OCD register 310 is controlled by a clock signal (denoted as TCK signal 363) applied to a clock port 311 of OCD register 310. The output of the OCD register 310 is coupled to each of the following: an input to the OCD input MUX 320 (illustratively, input 322), an input to the UpOCD input MUX 340 (illustratively, input 341), and the TDO output port 362 (which provides access to downstream cells of the scan chain).

The UpOCD input MUX 340 associated with the UpOCD register 330 controls input to UpOCD register 330. The UpOCD input MUX 340 includes two input ports 341 and 342. The UpOCD input MUX 340 accepts as inputs: (a) at input port 341, the output from the OCD register 310, and (2) at input port 342, the output from UpOCD register 330. The UpOCD input MUX 340 is controlled by the UpDR control signal 365 applied to a control port 343 of the UpOCD input MUX 340. When the UpDR control signal 365 is "1", UpOCD input MUX 340 passes the signal from the output of OCD register 310 into UpOCD register 330 (via input port 341). When the UpDR control signal 365 is "0", UpOCD input MUX 340 passes the signal from the output of UpOCD register 330 into UpOCD register 330 (via input port 342).

The UpOCD register 330 accepts input from the output of UpOCD input MUX 340. The UpOCD register 330 is controlled by a clock signal (denoted as TCK signal 363) applied to a clock port 331 of UpOCD register 330 and a Secure Reset (SecureRST) signal 369 applied to a control port 332 of OCD register 310. The output of the UpOCD register 330 is coupled to an input to the UpOCD input MUX 340 (illustratively, input 342) and a control port 353 of the input MUX 350.

The input MUX 350 includes two input ports 351 and 352. The input MUX 350 accepts as inputs: (1) at input port 351, an open circuit (e.g., input port 351 is not coupled to any other component), and (2) at input port 352, input from the TDI input port 361 (which provides access from upstream cells of the scan chain). The output of input MUX 350 is coupled to the input port 321 of OCD input MUX 320 (for propagation of signals to the TDO output 362 of OCD cell 300 via OCD register 310. The output of input MUX 350 is determined by a control signal applied to a control port 353 of the input MUX 350. The output of the UpOCD register 330 is coupled to the control port 353 of input MUX 350 for controlling input MUX 350. The UpOCD register 330 is controlled by SecureRST signal 369, which resets UpOCD register 330 to a known value ('1' or '0').

The UpOCD register 330 is configured for controlling input MUX 350 to create the open-circuit condition in the scan chain (via selection of input port 351 at input MUX 350) and to remove the open-circuit condition from the scan chain (via selection of input port 352 at input MUX 350, which connects the TDI input 361 of OCD cell 300 to the TDO output 362 of OCD cell 300 (via OCD register 310), both of which are connected to the scan).

In this sense, UpOCD register 330 and input MUX 350 each may be considered to be are components configured for creating and removing an open-circuit condition from a scan chain.

The UpOCD register 330 is a component configured to create the open-circuit condition in the scan chain in response to a first control signal (e.g., a scan register value received via the scan chain). The UpOCD register 330 is configured to create the open-circuit condition by instructing input MUX 351 to select input port 351 (via a control signal provided from the output of UpOCD register 330 to control port 353 of input MUX 350).

The UpOCD register 330 is a component configured to remove the open-circuit condition from the scan chain in response to a second control signal (e.g., the SecureRST signal received at UpOCD register 330). The UpOCD register 330 is configured to remove the open-circuit condition by instructing input MUX 351 to select input port 352 (via a control signal provided from the output of UpOCD register 330 to control port 353 of input MUX 350).

The input MUX 350 is a component configured to create the open-circuit condition in the scan chain in response to a first control signal, where the first control signal is a control signal received at control port 353 of the input MUX 350 from the output of UpOCD register 330 (e.g., in response to a scan register value being received by UpOCD register 330). The input MUX 350 is configured to create the open-circuit condition in the scan chain by selecting input port 351 in response to the first control signal.

The input MUX 350 is a component configured to remove the open-circuit condition in the scan chain in response to a second control signal, where the second control signal is a control signal received at control port 353 of the input MUX 350 from the output of UpOCD register 330 (e.g., in response to the SecureRST signal being received by UpOCD register 330). The input MUX 350 is configured to remove the open-circuit condition in the scan chain by selecting input port 352 in response to the second control signal.

As described herein, SecureRST signal 369 is adapted for use in controlling input MUX 350, via UpOCD register 330, thereby enabling controlled switching, by input MUX 350, from selection of the open-circuit input via input port 351 (such that the scan chain is subject to an open-circuit condition in which normal use of the scan chain is prevented) to selection of an input from TDI input port 361 via input port 352 (such that the open-circuit condition is removed from the scan chain and normal use of the scan chain is possible).

Thus, the SecureRST signal 369 is configured to control the operation of the OCD cell 300 for enabling the removal of the open-circuit condition from the associated scan chain in a controlled manner.

As may be seen from a comparison of FIG. 2 and FIG. 3, OCD cell 300 of FIG. 3 is similar to SIB cell 200 of FIG. 2, with at least the following differences being implemented:

(1) the derivation of the oTDI-iTDO is purposefully left open (as indicated by the open circuit at the input port 351 of input MUX 350); and (2) the UpOCD register 330, which controls the input MUX 350, is placed after the MUX 350.

As a result of these differences, (a) once the OCD cell 300 is enabled, the scan chain enters a deadlock state, thereby creating an open circuit in the scan chain which prevents normal use of the scan chain, and which cannot be removed through traditional scan access, and (b) the only way to remove the deadlock state and, thus, close the circuit and restore normal operating capability of the scan chain, is by asserting the SecureRST signal 369. In this manner, the level of security of normal use of the scan chain may be made dependent on the level of security of the process by which the SecureRST signal is generated.

The SecureRST signal 369 may be generated in any suitable manner (e.g., by any suitable component, in response to any suitable condition(s), and the like).

In at least some such embodiments for generation of the SecureRST signal 369, one or more of the following principles may be employed:

(1) the SecureRST signal 369 is not tied to the traditional reset capability associated with JTAG scan access, otherwise a normal reset operation would re-enable full scan chain access (i.e., break the deadlock state, and thus, close the circuit and restore normal operating capability of the scan chain);

(2) the UpOCD cell 300 may be a persistent storage (e.g., powered by a battery, or may be set to "open" upon reset; and (3) the SecureRST signal 369 may be generated inside the same chip in which the OCD cell 300 is disposed (such that it is impossible to access via a probe), or the SecureRST signal 369 may be routed on the board in a manner for hiding the SecureRST signal 369 or making the SecureRST signal 369 difficult to access (e.g., in an internal layer or using any other suitable manner of hiding the SecureRST signal 369 or making the SecureRST signal 369 difficult to access).

In order for OCD cell 300 to be effective in securing normal use of the scan chain, its status is persistent, i.e. it resists through a power cycle. Otherwise, a simple power cycle would be enough to break the security of OCD cell 300 and re-establish normal use of the scan chain. The status of OCD cell 300 may be made persistent in any suitable manner, such as:

(1) by using persistent memory storage (e.g., FLASH cell or any other suitable persistent memory storage) for UpOCD register 330;

(2) by ensuring that the default value after a power cycle leaves the open circuit condition active (i.e. input 351 is selected at input MUX 350), which may be done in any suitable manner, e.g., by (a) using a reset signal for UpOCD register 330 (not depicted in FIG. 3), (b) in an FPGA application, defining the default value of UpOCD in the programming bitstream, and the like.

The status of OCD cell 300 may be made persistent in any other suitable manner.

Similarly, for the SecureRST signal 369 and its associated generation components/logic, at no time is the signal allowed to float, and imperatively it is non-active at startup. This may be achieved using any suitable techniques, such as by enforcing these properties at circuit generation time and checking them with techniques such as formal validation, or using any other suitable techniques.

Figure 4A:
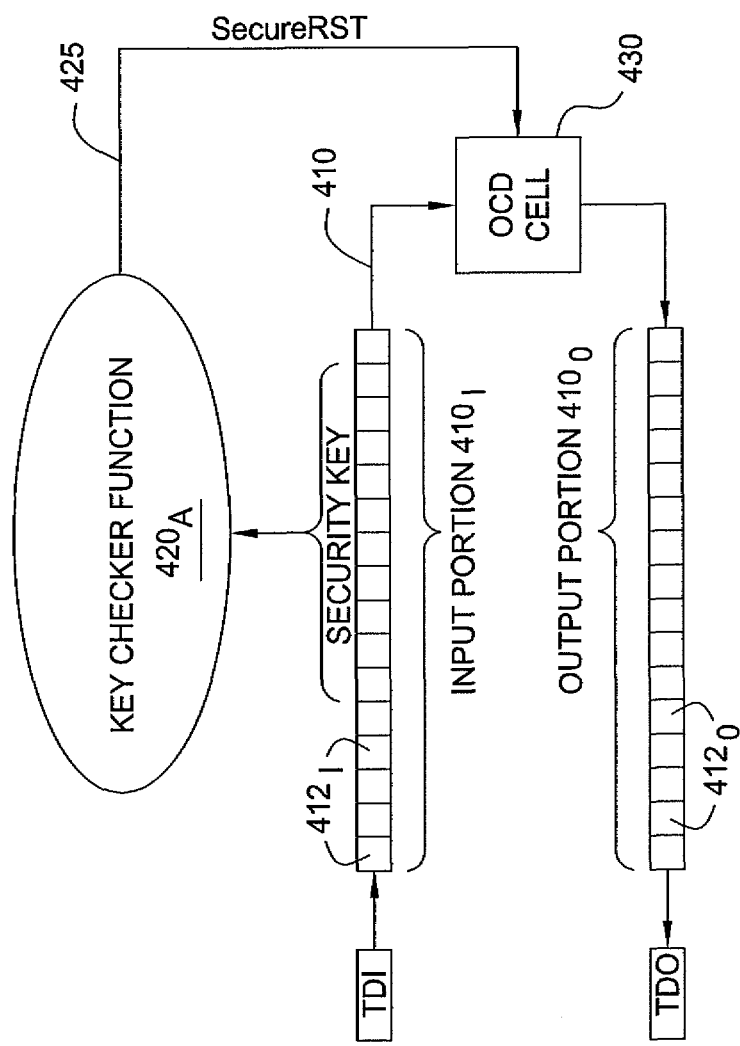
FIG. 4A depicts one embodiment of generation of a SecureRST signal via validation by a key checker function of a security key shifted into an input portion of the scan chain being secured.
Figure 4B:
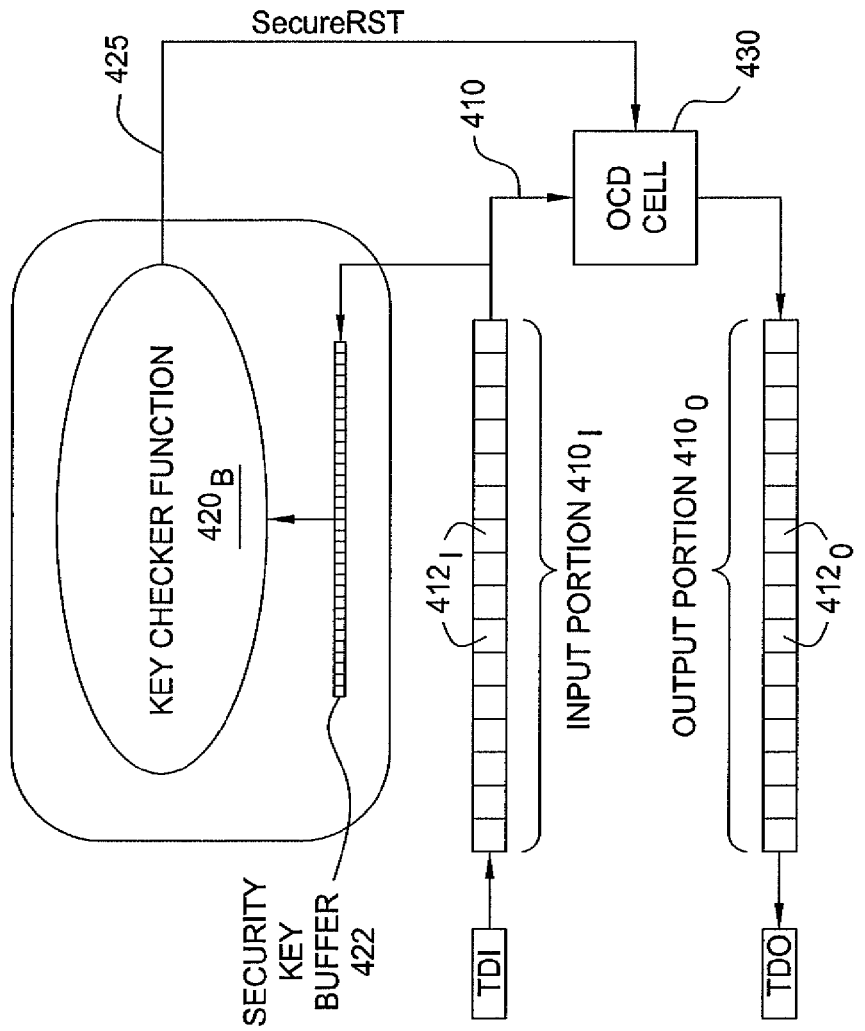
FIG. 4B depicts one embodiment of generation of a SecureRST signal via validation by a key checker function of a security key shifted into a buffer of the key checker function.
Figure 5:
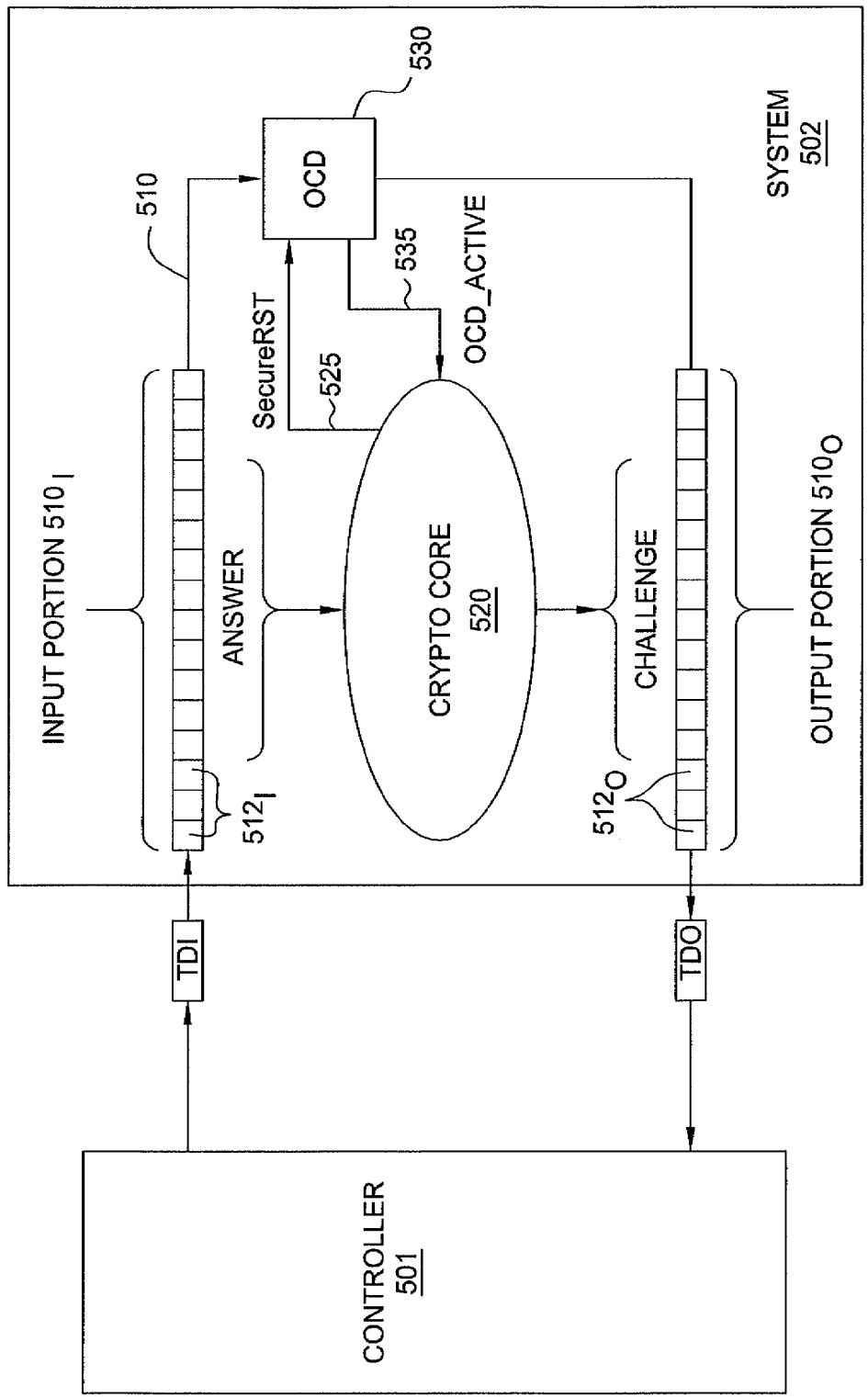
FIG. 5 depicts one embodiment of generation of a SecureRST signal via use of a challenge-based authentication method.
Figure 6:
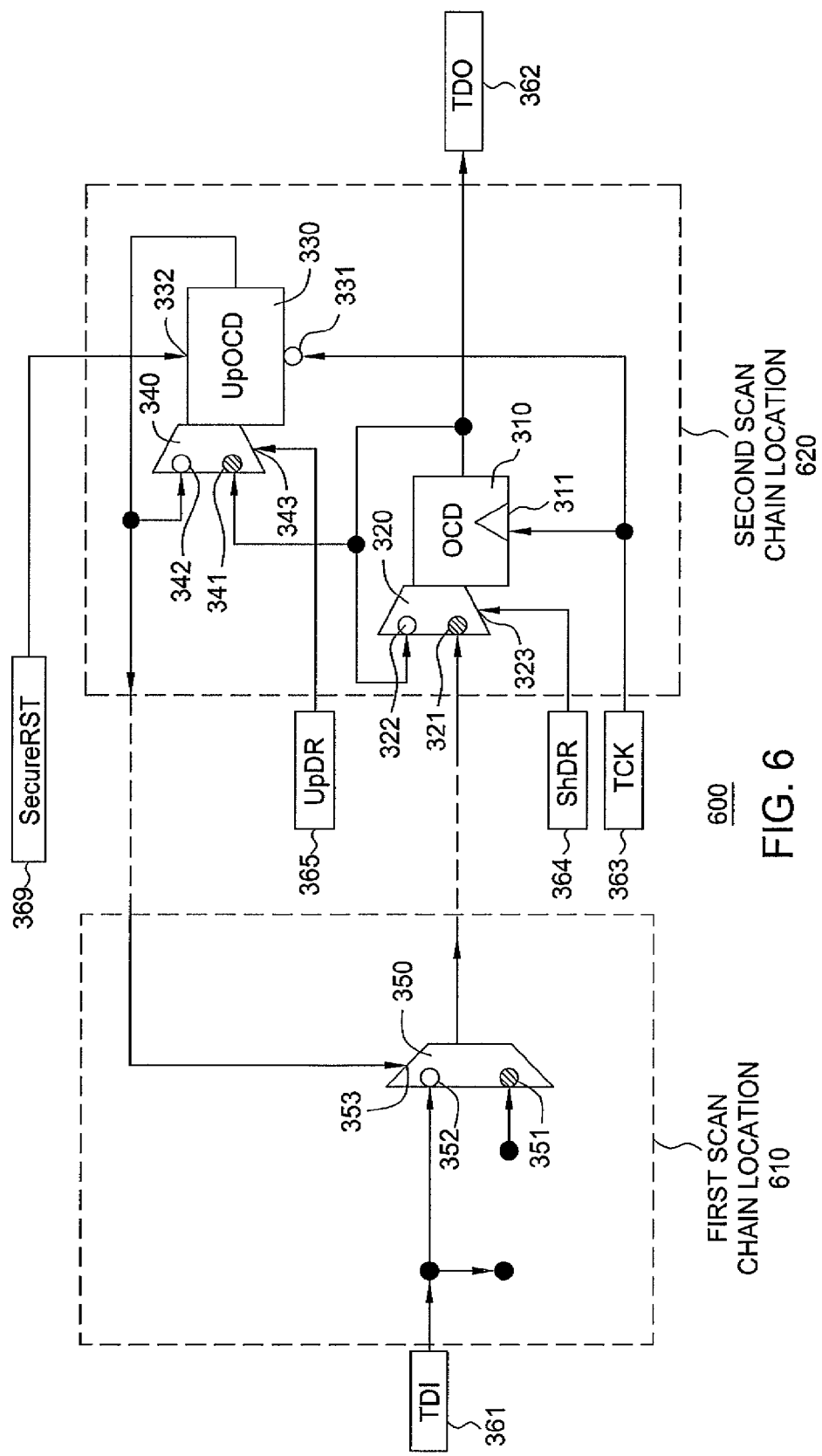
FIG. 6 depicts one embodiment of a remote OCD cell configured for use in controlling scan chain security.

The SecureRST signal 369 may be generated in any suitable manner, as depicted and described with respect to FIGS. 4-6, which depict various embodiments for generation of the SecureRST signal 369.

In one embodiment, SecureRST signal 369 is generated in response to validation of a secure key by a key checker function.

FIG. 4A depicts one embodiment of generation of a SecureRST signal via validation by a key checker function of a security key shifted into an input portion of the scan chain being secured. Although primarily depicted and described with respect to generation of the SecureRST signal for use by the OCD cell 300 of FIG. 3, it will be appreciated that the embodiments of FIG. 4A may be utilized for generating a security control signal for use by any suitable scan chain security component.

As depicted in FIG. 4A, a system 401 having a scan chain 410 has an OCD cell 430 disposed within the scan chain 410. The system 401 includes a key checker function $420_A$ that is configured for generating a control signal in response to validating a security key, where the control signal is adapted for use in controlling OCD cell 430.

The scan chain 410 includes an input portion $410_I$ of scan chain 410, which is coupled to a TDI input to system 401 (e.g., from a TAP or other test access interface) and to OCD cell 430. The input portion $410_I$ of scan chain 410 includes a plurality of cells $412_I$ (illustratively, 16 cells). The input portion $410_I$ of scan chain 410 is capable of being written to, but not capable of being read, while OCD cell 430 is configured to cause an open-circuit condition in the scan chain 410.

The scan chain 410 includes an output portion $410_O$ of scan chain 410, which is coupled to OCD cell 430 and to a TDO output from system 401 (e.g., to a TAP or other test access interface). The output portion $410_O$ of scan chain 410 includes a plurality of cells $412_O$ (illustratively, 16 cells). The output portion $410_O$ of scan chain 410 is capable of being read, but not capable of being written to, while OCD cell 430 is configured to cause an open-circuit condition in the scan chain 410.

The OCD cell 430 may be implemented in any suitable manner. In one embodiment, OCD cell 430 is implemented as OCD cell 300 of FIG. 3, or may be implemented using any other suitable OCD cell or other suitable scan chain security component. The TDI input of OCD cell 430 (omitted for purposes of clarity, but analogous to TDI input 361 of OCD cell 300 of FIG. 3) is coupled to the cell of input portion $410_I$ of scan chain 410 that is farthest from the TDI input to system 401. The TDO output of OCD cell 430 (omitted for purposes of clarity, but analogous to TDO input 362 of OCD cell 300 of FIG. 3) is coupled to the cell of output portion $410_O$ of scan chain 410 that is farthest from the TDO output from system 401.

The key checker function $420_A$ is configured for generating a control signal (illustratively, a SecureRST signal 425) in response to validating a security key shifted into input portion $410_I$ of scan chain 410.

The security key is shifted into the input portion $410_I$ of scan chain 410 when the OCD cell 430 is configured to cause an open-circuit condition in the scan chain 410, for purposes of triggering the OCD cell 430 to remove the open-circuit condition and allow normal use of the scan chain 410.

The security key may be any suitable length, which may depend on the size of the input portion $410_I$ of the scan chain 410. In one embodiment, the length of the security key is less than or equal to the length of the input portion $410_I$ of the scan chain 410.

The security key may be scanned into any suitable location within the input portion $410_I$ of the scan chain 410, thereby providing stronger security as not only would a malicious attacker need to know the value of the security key, the malicious attacker also would need to know exactly where to place the security key in order to unlock the scan chain 410 (i.e., in order to remove the open-circuit condition).

In the example of FIG. 4A, the security key is a ten bit value occupying bit positions 5 through 14 of the input portion 410, of the scan chain 410 (where bit position 0 of input portion $410_I$ is adjacent to the TDI of system 401 and bit position 15 of input portion 4101 is adjacent to the TDI of OCD cell 430). It will be appreciated that the security key may use any other suitable number of bits which may be read from any other suitable location within the input portion $410_I$ of the scan chain 410.

FIG. 4B depicts one embodiment of generation of a SecureRST signal via validation by a key checker function of a security key shifted into a buffer of the key checker function. Although primarily depicted and described with respect to generation of the SecureRST signal for use by the OCD cell 300 of FIG. 3, it will be appreciated that the embodiments of FIG. 4B may be utilized for generating a security control signal for use by any suitable scan chain security component.

As depicted in FIG. 4B, system 402 is nearly identical to system 401 of FIG. 4A, with the exception of the source of the security key for validation by key checker function 420. Namely, in system 402, a key checker function $420_B$ is configured to read the security key from a security key buffer 422 associated with key checker function $420_B$ (rather than from input portion $410_I$ of scan chain 410, as is done by key checker function $420_A$ of system 401 of FIG. 4A).

The security key buffer 422 is independent from the scan chain 410 and, thus, the length of the security key is not dependent on the length of the input portion $410_I$ of scan chain 410. As a result, the security key can be any suitable length and, further, may be further secured as desired (e.g., hidden, scrambled, and the like).

The security key buffer 422 may be implemented in any suitable manner. In one embodiment, the security key buffer 422 may be external from the key checker function $420_B$. In one embodiment, the security key buffer 422 may be internal to key checker function $420_B$.

The security key buffer 422 may receive the security key from any suitable source. The source of the security key may be disposed on system 402 or may be remote from system 402. In one embodiment, security key buffer 422 may receive the security key from the input portion $410_I$ of scan chain 410. In this embodiment, the security key buffer 422 may be coupled to the input portion $410_I$ of scan chain 410 at any suitable location in the input portion $410_I$ of scan chain 410. In one such embodiment, for example, as depicted in FIG. 4A, the security key buffer 422 may be coupled to the input portion $410_I$ of scan chain 410 at the point at which the input portion $410_I$ of scan chain 410 is coupled to the TDI input port of OCD cell 430. It will be appreciated that the security key buffer 422 may be coupled to the input portion $410_I$ of scan chain 410 at any other suitable location. In one embodiment, security key buffer 422 may receive the security key from another scan chain (not depicted). It will be appreciated that the security key buffer 422 may receive the security key from any other suitable source.

The security key is provided to security key buffer 422 when the OCD cell 430 is configured to cause an open-circuit condition in the scan chain 410, for purposes of triggering the OCD cell 430 to remove the open-circuit condition and allow normal use of the scan chain 410.

The key checker function $420_B$ may read the security key from security key buffer 422 serially or in parallel.

The key checker function $420_B$ is configured for generating a control signal (illustratively, a SecureRST signal 425) in response to validating a security key available within security key buffer 422.

The key checker functions $420_A$ and $420_B$ of systems 401 and 402, respectively, may have various functions and/or capabilities in common and, thus, may be referred to collectively as key checker functions 420.

In one embodiment, security key check operations may be executed by the key checker functions 420 independent of whether or not the OCD cell 430 is active.

In one embodiment, security key check operations are executed by key checker functions 420 only when the OCD cell 430 is determined to be active. In other embodiments, the OCD cell 430 would be reset each time a security key is inserted into the input portion of the scan chain. This would not cause a security issue, but may result in useless switching activity.

The key checker functions 420 may be implemented in any suitable manner.

In one embodiment, for example, a key checker function 420 may be implemented as a comparator to a hard-wired value. In one embodiment, for example, an FPGA may decide the "hard-wired" values of the circuits that it implements at bitstream generation time, such that the designer may select his or her own value and, further, may change the value after each update.

In one embodiment, for example, the security key that is validated by the key checker functions 420 may be obtained from one-time programmable elements (e.g., a fuse/antifuse box).

In one embodiment, for example, the security key that is validated by the key checker functions 420 may be obtained from one or more secure storage elements (e.g., flip-flops, Electrically Erasable Programmable Read-Only Memory (EEPROM) with battery backup, and the like, as well as various combinations thereof).

In one embodiment, for example, a key checker function 420 may be implemented as a cryptographic IP or other suitable circuitry.

The key checker functions 420 may be implemented in any other suitable manner.

Thus, it will be appreciated that the security key based embodiments of the scan chain security capability can scale as needed, enabling various tradeoffs in complexity, security, and flexibility.

Although primarily depicted and described with respect to specific embodiments for using validation of a security key to trigger generation of a control signal for re-enabling normal use of a scan chain, it will be appreciated that using validation of a security key to trigger generation of a control signal for re-enabling normal use of a scan chain may be implemented in any other suitable manner. It will be further appreciated that generation of such control signals may be performed for controlling OCD cells or any other suitable scan chain security components.

In one embodiment, the SecureRST signal 369 is generated using a challenge-based authentication method.

FIG. 5 depicts one embodiment of generation of a SecureRST signal via use of a challenge-based authentication method. Although primarily depicted and described with respect to generation of the SecureRST signal for use by the OCD cell 300 of FIG. 3, it will be appreciated that the embodiments of FIG. 5 may be utilized for generating a security control signal for use by any suitable scan chain security component.

As depicted in FIG. 5, a system 500 includes a controller 501 and a system 502.

The controller 501 is configured for controlling system 502. The controller 501 is any controller suitable for accessing system 502 via a test access interface (e.g., testing system 110 of FIG. 1).

The system 502 includes a scan chain 510 having an OCD cell 530 disposed within the scan chain 510.

The system 502 includes a cryptographic core 520 that is configured for generating a control signal in response to satisfaction of a challenge in a challenge-based authentication method.

The scan chain 510 includes an input portion $510_I$ of scan chain 510, which is coupled to a TDI input to system 502 (e.g., from a TAP or other test access interface) and to OCD cell 530. The input portion $510_I$ of scan chain 510 includes a plurality of cells $512_I$ (illustratively, 16 cells). The input portion $510_I$ of scan chain 510 is capable of being written to, but not capable of being read, while OCD cell 530 is configured to cause an open-circuit condition in the scan chain 510.

The scan chain 510 includes an output portion $510_O$ of scan chain 510, which is coupled to OCD cell 530 and to a TDO output from system 502 (e.g., to a TAP or other test access interface). The output portion $510_O$ of scan chain 510 includes a plurality of cells $512_O$ (illustratively, 16 cells). The output portion $510_O$ of scan chain 510 is capable of being read, but not capable of being written to, while OCD cell 530 is configured to cause an open-circuit condition in the scan chain 510.

The OCD cell 530 may be implemented in any suitable manner. In one embodiment, OCD cell 530 is implemented as OCD cell 300 of FIG. 3, or may be implemented using any other suitable OCD cell or other suitable scan chain security component. The TDI input of OCD cell 530 (omitted for purposes of clarity, but analogous to TDI input 361 of OCD cell 300 of FIG. 3) is coupled to the cell of input portion $510_I$ of scan chain 510 that is farthest from the TDI input to system 502. The TDO output of OCD cell 530 (omitted for purposes of clarity, but analogous to TDO input 362 of OCD cell 300 of FIG. 3) is coupled to the cell of output portion $510_O$ of scan chain 510 that is farthest from the TDO output from system 502. The OCD cell 530 is configured to activate cryptographic core 520 via a control signal (illustratively, OCD_active signal 535).

The cryptographic core 520 is configured for generating a control signal (illustratively, the SecureRST signal 525) in response to satisfaction of a challenge in a challenge-based authentication method.

In one embodiment, the challenge-based authentication method proceeds as follows. The cryptographic core 520 is enabled by the OCD cell 530 via the OCD_active signal 535 provided from the OCD cell 530 to the cryptographic core 520. The cryptographic core 520, in response to being enabled, issues a challenge by writing a challenge value in the output portion $510_O$ of scan chain 510. The cryptographic core 520 generates the challenge value using a cryptographic algorithm. The controller 501 reads the challenge value from the output portion $510_O$ of scan chain 510 via a scan operation. The controller 501 uses the challenge value to compute an associated answer value. The controller 501 computes the answer value using the cryptographic algorithm. The controller 501 writes the answer value into the input portion $510_I$ of scan chain 510 via a scan operation. Thus, controller 501 is configured to operate as an answer component configured for computing an answer for the challenge-based authentication method. The cryptographic core 520 reads the answer value from the input portion $510_I$ of scan chain 510 and attempts to validate the answer value. If the cryptographic core 520 validates the challenge value (i.e., the challenge is met, or satisfied), the cryptographic core 520 generates the SecureRST 525 signal (i.e., the open-circuit condition in scan chain 510 is removed, thereby unlocking scan chain 510 for enabling normal use of scan chain 510). If the cryptographic core 520 does not validate the challenge value (i.e., the challenge is no met), the cryptographic core 520 does not generate the SecureRST 525 signal (i.e., the open-circuit condition in scan chain 510 is maintained such that the scan chain 510 remains locked and normal use of scan chain 510 is prevented).

The system 502 is configured to initiate the challenge-based authentication method when the OCD cell 530 is configured to cause an open-circuit condition in the scan chain 510, for purposes of triggering the OCD cell 530 to remove the open-circuit condition and allow normal use of the scan chain 510.

The challenge value and the answer value may have any suitable lengths, which may depend on the sizes of the input and output portions $510_I$ and $510_O$ of the scan chain 510, respectively. In one embodiment, the lengths of the challenge and answer values are less than or equal to the lengths of the input and output portions $510_I$ and $510_O$ of the scan chain 510, respectively.

The challenge value and the answer value may be scanned into any suitable locations within the input and output portions $510_I$ and $510_O$ of the scan chain 510, thereby providing stronger security since not only would a malicious attacker need to know the values of the challenge and answer values, the malicious attacker also would need to know exactly from where to read the challenge value and exactly where to place the answer value in order to remove the open-circuit condition and, thus, re-enable normal use of the scan chain.

In the example of FIG. 5, the challenge value and the answer value each are ten bit values occupying bit positions 3 through 12 of the input and output portions $510_I$ and $510_O$ of the scan chain 510 (where bit position 0 of input portion $510_I$ is adjacent to the TDI of system 502 and bit position 0 of output portion $510_O$ is adjacent to the TDO of OCD cell 530), respectively. It will be appreciated that the challenge value and the answer value may use any other suitable numbers of bits which may be read from any other suitable locations within the input and output portions $510_I$ and $510_O$ of the scan chain 510.

Although primarily depicted and described with respect to embodiments in which the controller 501, which is configured for accessing system 502 via a test access interface, operates as the answer component for computing the answer for the challenge-based authentication method, it will be appreciated that any other remote component may compute the answer for the challenge-based authentication method.

Although primarily depicted and described herein with respect to embodiments in which the challenge and answer values are obtained from the scan chain 510, it will be appreciated that the challenge and/or answer values may be obtained from any other suitable source of such values.

In one embodiment, for example, a buffer-based scheme(s) (e.g., similar to the buffer-based scheme used for obtaining the security key in FIG. 4B) may be employed for obtaining the challenge and/or answer values. For example, a single buffer may be used to store both the challenge and answer values. For example, a challenge buffer may be used to store the challenge value and/or an answer buffer may be used to store the answer value. It will be appreciated that implementation of such buffer schemes may be similar to implementation of the buffer scheme of FIG. 4B (i.e., similar to modification of FIG. 4A using the buffer scheme of FIG. 4B).

In one embodiment, for example, the challenge and/or answer values may be obtained from a source that is completely independent from the system 500 (e.g., from a different scan chain).

It will be appreciated that the challenge and/or answer values may be obtained from any other suitable source(s).

Although primarily depicted and described with respect to specific embodiments for using a challenge-based authentication method to trigger generation of a control signal for re-enabling normal use of a scan chain, it will be appreciated that using a challenge-based authentication method to trigger generation of a control signal for re-enabling normal use of a scan chain may be implemented in any other suitable manner. It will be further appreciated that generation of such control signals may be performed for controlling OCD cells or any other suitable scan chain security components.

Although primarily depicted and described herein with respect to embodiments in which the OCD cell is implemented as a single device where the point of interruption of the scan chain is immediately prior to the OCD cell on the scan chain (e.g., OCD cell 300 of FIG. 3), in one embodiment the OCD cell may be modified such that the point of interruption of the scan chain is in a different location than the OCD registers. In one such embodiment, a first portion of the OCD cell is disposed in a first location in the scan chain and a second portion of the OCD cell is disposed in a second location in the scan chain, where the first and second locations may be anywhere within the scan chain. An exemplary embodiment is depicted and described with respect to FIG. 6.

FIG. 6 depicts one embodiment of a remote OCD cell configured for use in controlling scan chain security.

As depicted in FIG. 6, the operation of remote OCD cell 600 is identical to the operation of OCD cell 300 of FIG. 3 (and, thus, the numbering of the components of remote OCD cell 600 is identical to the numbering of the components of OCD cell 300 of FIG. 3), however, the remote OCD cell 600 is implemented using two physical devices placed in two different locations within the scan chain (rather than using a single physical device implemented within a single location of the scan chain, as with the OCD cell 300 of FIG. 3).

As depicted in FIG. 6, the input MUX 350 of OCD cell 300 is disposed within a first scan chain location 610 and the remaining components of OCD cell 300 (e.g., OCD register 310, OCD input MUX 320, UpOCD register 330, UpOCD input MUX 340, and related components) are disposed within a second scan chain location 620, thereby forming the remote OCD cell 600. The first scan chain location 610 and second scan chain location 620 may be located anywhere on the scan chain.

As such, since the scan chain interruption point is located at the output of input MUX 350 at the first scan chain location 610 and the input MUX 350 is controlled via a control signal generated by UpOCD register 350 under the control of the SecureRST signal 369 at the second scan chain location 620, the scan chain interruption point is physically remote from the location of the scan chain interruption control logic. In this manner, the designer is able to hide the location of the scan chain interruption control logic, thereby providing additional security for controlling access to normal use of the scan chain.

Although primarily depicted and described herein with respect to embodiments in which a single OCD cell (e.g., OCD cell 300 of FIG. 3 or remote OCD cell 600 of FIG. 6) is used for providing scan chain security, in other embodiments multiple OCD cells may be used in combination for providing scan chain security such that the level of scan chain security is further enhanced.

In such embodiments, the multiple OCD cells may be implemented using one or more cell combination architecture types (e.g., using one or more of cascading of OCD cells, interlocking of OCD cells, and like techniques for using combinations of OCD cells to provide scan chain access).

In one embodiment, for example, multiple or even many security key based SecureRST generation implementations (e.g., as depicted and described with respect to FIGS. 4A and/or 4B) may be cascaded one after the other within the scan chain for securing access to normal use of the scan chain.

In one embodiment, for example, various combinations of the security key based implementation for SecureRST generation (e.g., as depicted and described with respect to FIGS. 4A and/or 4B) and the challenge-based authentication method for SecureRST generation implementation (e.g., as depicted and described with respect to FIG. 5) may be used for securing access to normal use of the scan chain.

In one embodiment, for example, multiple time-cascaded OCD cells may be employed to provide secure scan chain access. In one such embodiment, for example, each of the OCD cells must be unlocked in a certain time in order to unlock scan chain access, otherwise the lock on the scan chain is re-asserted. This may be implemented in any suitable manner.

It will be appreciated that various other arrangements of such OCD cell types, SecureRST generation implementations/methods, and/or OCD cell combination architectures may be used for securing access to normal use of the scan chain (e.g., using one or more OCD cells 300 of FIG. 3 and/or one or more remote OCD cells 600 of FIG. 6, using one or more of the security key based implementations for SecureRST generation of FIG. 4A and/or FIG. 4B, using one or more challenge-based authentication methods for SecureRST generation of FIG. 5, and the like, as well as various combinations thereof).

In such embodiments, it will be appreciated that remote OCD cells (e.g., such as remote OCD cell 600 of FIG. 6) may be configured not only with a separation of the interruption point and the control logic at different locations within the same hierarchical level of the same scan chain, but also may be configured to provide separation of the interruption point and the control logic at different hierarchical levels of the same scan, within different scan chains, and the like, as well as various combinations thereof.

In such embodiments, it will be appreciated that, since each OCD cell is a simple, low-cost cell (e.g., composed of only one scan register (two bits) and three multiplexers), use of multiple OCD cells within the same system is a cost-effective way of providing enhanced scan chain security.

Although primarily depicted and described herein with respect to embodiments in which the SecureRST signal is generated within the system within which the scan chain security component is disposed, the SecureRST signal may be generated at any suitable location, including locations outside of the system within which the scan chain security component is disposed.

In one embodiment, for example, a processor on the chip may be configured to perform an authentication algorithm for determining when to generate the SecureRST signal. In this embodiment, since generation of the SecureRST signal is controlled by the processor, scan chain security is controlled by the processor and, therefore, numerous possibilities are available for controlling scan chain security. In one such embodiment, for example, the processor may be accessed remotely for (1) instructing the processor to put the system in "test mode" by re-enabling normal use of the scan chain of the system (e.g., by removing the open-circuit condition created within the scan chain using one or more scan chain security embodiments depicted and described herein) and (2) upon completion of testing, instructing the processor to secure the scan chain in order to prevent normal use of the scan chain (e.g., by reasserting the open-circuit condition in the scan chain, such as via use of one or more OCD cells or other embodiments depicted and described herein), such that the system is again placed in a secure state following completion of testing. In such embodiments, remote access to the processor may be implemented in any suitable manner, e.g., via a direct physical connection, via a networked connection (e.g., an Internet connection or other suitable network connection), and the like. It will be appreciated that this type of scan chain security control is beneficial for applications such as in-field and/or remote testing, maintenance, updates, and the like, as well as various combinations thereof.

As described herein, and as will be understood by one skilled in the art, in most JTAG systems the TAP is the sole point of access to the system. The configuration of an 1149.1 TAP is known in the art. The 1149.1 TAP enables access, to the scan chain of the system. The 1149.1 TAP is composed by a standardized Finite State Machine (FSM), and by an Instruction Register (IR) which defines its behavior. The 1149.1 TAP also supports a bypass function via inclusion of a Bypass Register: when a specific instruction (i.e., the BYPASS) is set into the IR, the 1149.1 TAP is set as transparent and only one bit (i.e., the bit of the Bypass Register) is present in the scan chain. This is a fundamental feature of JTAG which is useful when multiple JTAG systems are chained together. In one embodiment, scan chain security is provided by disposing an OCD cell within the 1149.1 TAP of the system. An exemplary embodiment for providing scan chain security via control of the 1149.1 TAP of the system is depicted and described with respect to FIG. 7.

Figure 7:
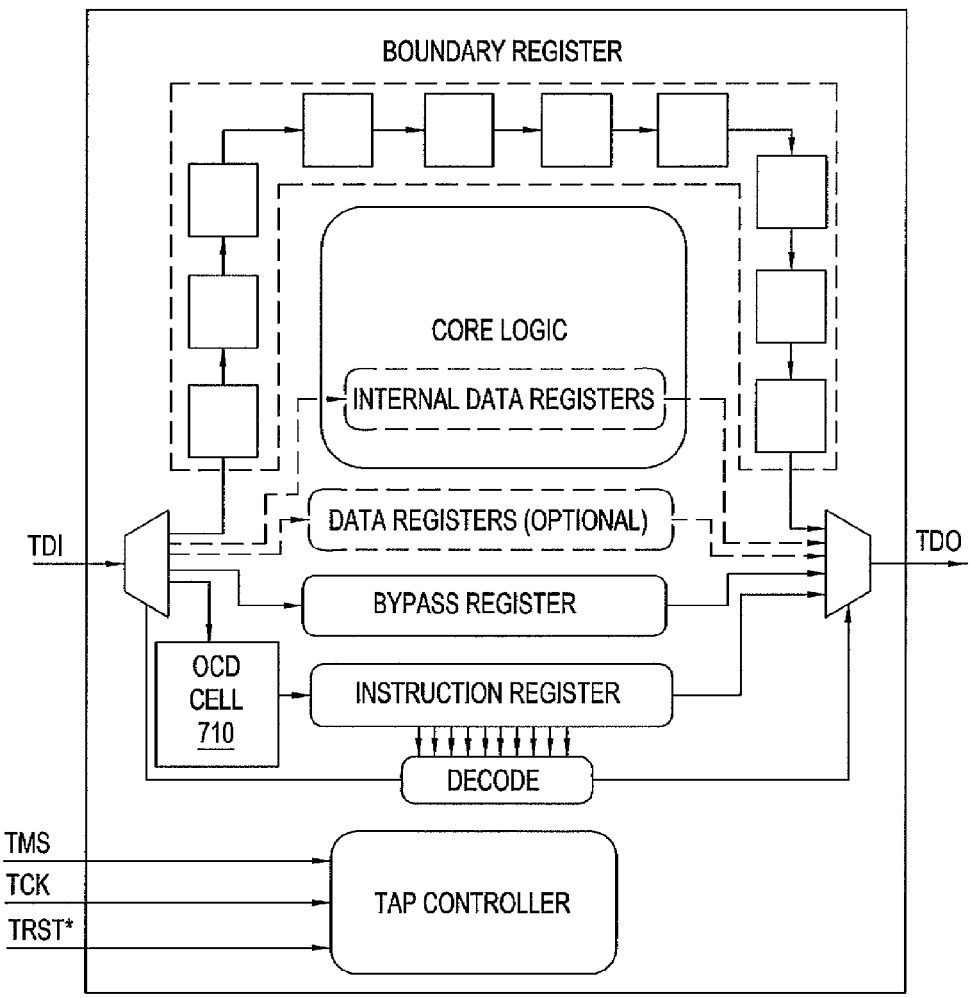
FIG. 7 depicts one embodiment of a TAP of a JTAG system where the TAP is configured for providing secure access to a scan chain of the JTAG system.

FIG. 7 depicts one embodiment of a TAP of a JTAG system where the TAP is configured for providing security for a scan chain of the JTAG system.

As depicted in FIG. 7, TAP 700 is a modified version of the 1149.1 TAP. The TAP 700 is formed by modifying the 1149.1 TAP, as defined in the 1149.1 standard, via insertion of an OCD cell 710 at the beginning of the Instruction Register (IR) of the 1149.1 TAP. The OCD cell 710 may be any suitable OCD cell, such as OCD cell 300 depicted and described with respect to FIG. 3. By disposing OCD cell 710 at the beginning of the IR, it becomes possible to define a BYPASS-DEAD-LOCK state for the TAP. In this case, once the instruction is set, the TAP 700 is put in bypass mode, and the OCD cell 710 locks the IR state, making it impossible to change the IR state. As a result, the JTAG system becomes completely inaccessible until the SecureRST signal is generated for unlocking the IR state.

In this embodiment, the SecureRST signal, configured for unlocking the IR state and, thus, providing access to JTAG system, may be generated in any suitable manner.

In one embodiment, the SecureRST signal is generated using any manner of SecureRST signal generation depicted and described herein.

In one embodiment, the SecureRST signal is generated by one of the chip processors.

In one embodiment, the SecureRST signal is received from a scan chain of another JTAG system.

In such embodiments, by introducing the open-circuit condition within the TAP, the entire scan chain of the associated system may be controllably locked and unlocked.

Although depicted and described hereinabove with respect to specific embodiments for unlocking access to a scan chain, in one embodiment one or more special TAP sequences may be utilized for unlocking access to a scan chain. In such embodiments, special transitions in the TAP FSM, which have no direct meaning or effect in strict JTAG terms, may be used for unlocking access to a scan chain. It will be appreciated that such special transitions may be used for other purposes (e.g., such as for superimposing other protocols over the IEEE 1149.1 standard), and is at the core of the Scan-Bridge and the IEEE 1149.7 approaches. By using special TAP transition sequences, such approaches are able to both introduce new system states and scan data in configurations in which it typically would not be possible in usual JTAG. As a result, ScanBridge, IEEE 1149.7, and other similar approaches, may be used for unlocking access to a scan chain. This technique for unlocking access to a scan chain may be used in conjunction with any of the other OCD-based embodiments depicted and described herein.

Figure 8:
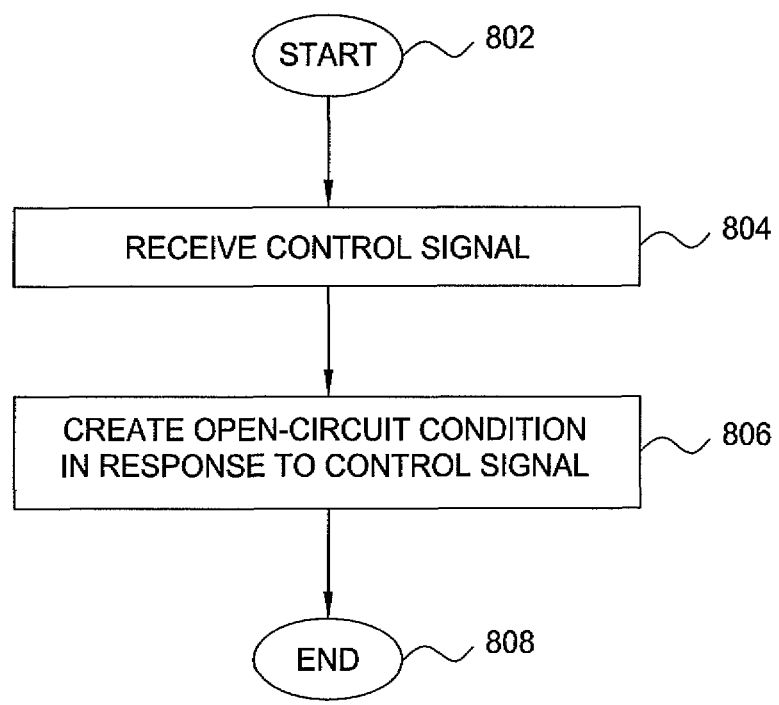
FIG. 8 depicts one embodiment of a method for creating an open-circuit condition in a scan chain.

FIG. 8 depicts one embodiment of a method for creating an open-circuit condition in a scan chain. In one embodiment, method 800 of FIG. 8 is performed by a scan chain security component associated with a scan chain, such as an OCD cell depicted and described herein. At step 802, method 800 begins. At step 804, a scan register value is received. The scan register value is received by the scan chain security component. The scan register value is received via the scan chain. At step 806, an open-circuit condition is created within the scan chain in response to the scan register value. At step 808, method 800 ends. As described herein, the open-circuit condition prevents normal use of the scan chain until a control signal is received for triggering removal of the open-circuit condition from the scan chain.

Figure 9:
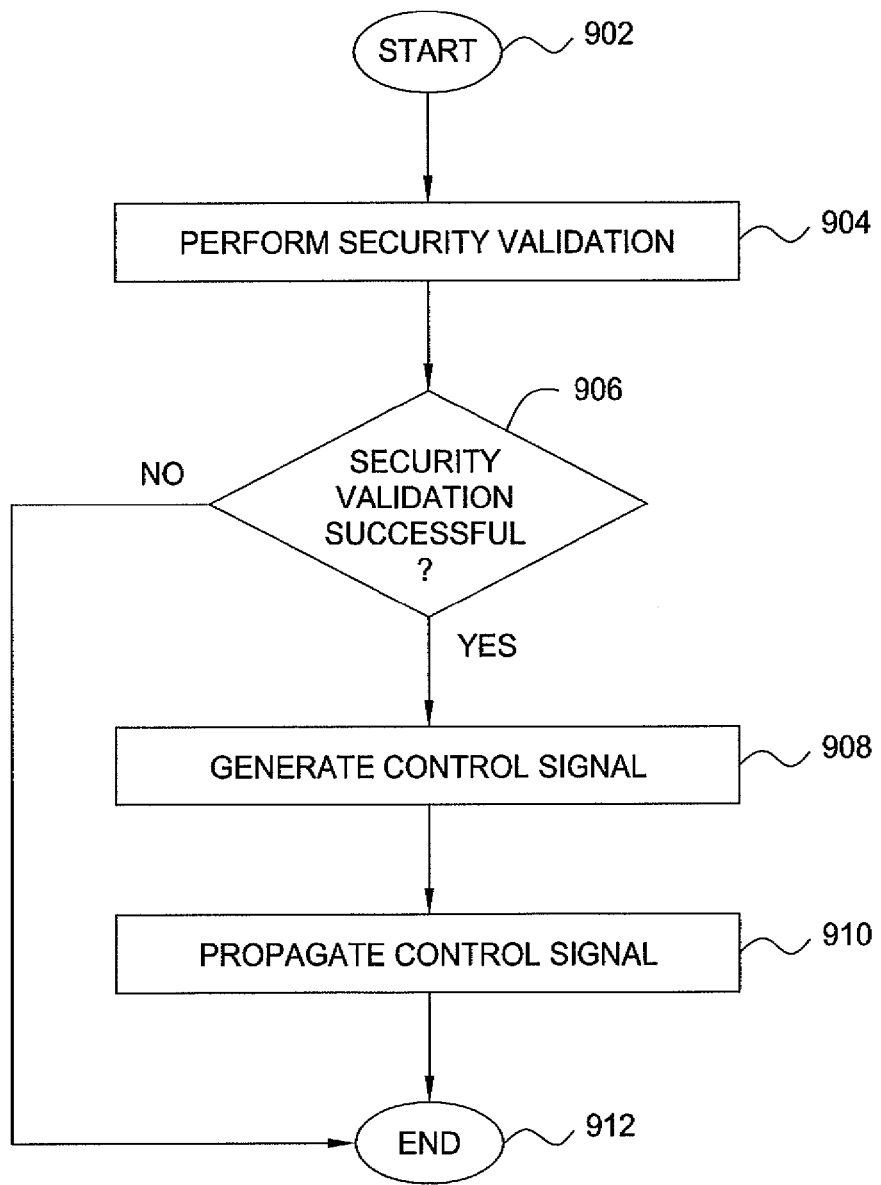
FIG. 9 depicts one embodiment of a method for generating a control signal for removing an open-circuit condition from a scan chain.

FIG. 9 depicts one embodiment of a method for generating a control signal for removing an open-circuit condition from a scan chain. In one embodiment, method 900 of FIG. 9 is performed by a security validation component(s), e.g., a key checker function, challenge-based authentication component (s), and the like.

At step 902, method 900 begins.

At step 904, a security validation is performed. The security validation may be performed in any suitable manner, e.g., validating a security key, using a challenge-based authentication process, and the like.

At step 906, a determination is made as to whether the security validation is successful. If the security validation is not successful, the method 900 proceeds to step 912, where method 900 ends without generation of a control signal configured for use in removing an open-circuit condition from the scan chain (i.e., normal use of the scan chain is prevented). If the security validation is successful, method 900 proceeds to step 908.

At step 908, a control signal is generated. The control signal is generated for use in removing an open-circuit condition from the scan chain (i.e., for re-enabling normal use of the scan chain).

At step 910, the control signal is propagated toward a component configured for use in removing an open-circuit condition from the scan chain in response to the control signal. From step 910, method 900 proceeds to step 912.

At step 912, method 900 ends.

Figure 10:
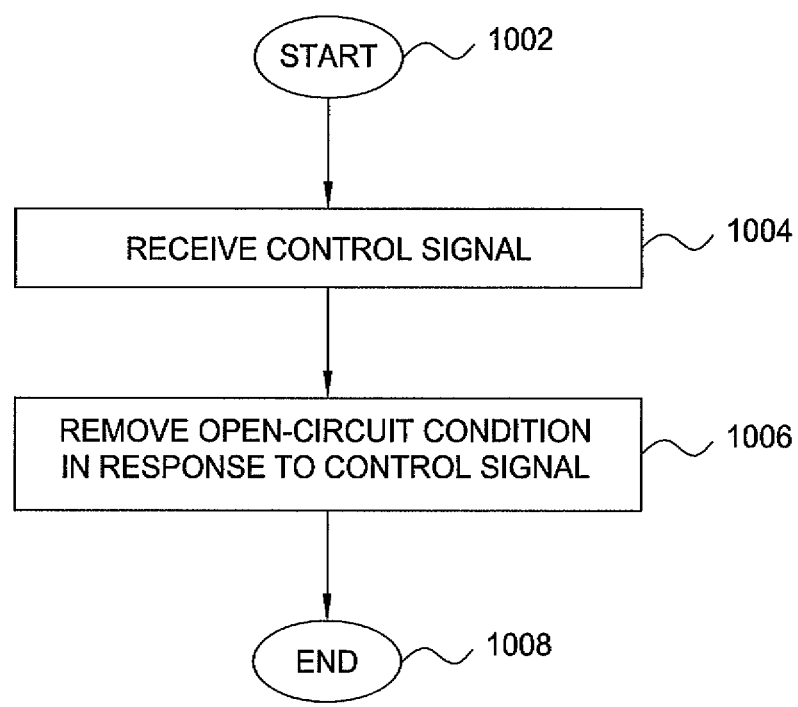
FIG. 10 depicts one embodiment of a method for using a control signal for removing an open-circuit condition from a scan chain.

FIG. 10 depicts one embodiment of a method for using a control signal for removing an open-circuit condition from a scan chain. In one embodiment, method 1000 of FIG. 10 is performed by a scan chain security component associated with a scan chain, such as an OCD cell depicted and described herein. At step 1002, method 1000 begins. At step 1004, a control signal is received. The control signal is received by the scan chain security component. The control signal may be received from any suitable source. At step 1006, an open-circuit condition within the scan chain is removed from the scan chain in response to the control signal. At step 1008, method 1000 ends. As described herein, the removal of the open-circuit condition in response to the control signal re-enables normal use of the scan chain.

Although primarily depicted and described herein with respect to use of an OCD cell having a specific configuration (illustratively, the embodiment of the OCD cell depicted and described with respect to FIGS. 3 and 6), it will be appreciated that any other suitable OCD cell, having any other suitable configuration, may be used for providing scan chain security.

Although primarily depicted and described herein with respect to use of one or more OCD cells, it will be appreciated that any other suitable scan chain security component(s) may be used, in conjunction with and/or in place of using the OCD cell, for providing scan chain security.

Figure 11:
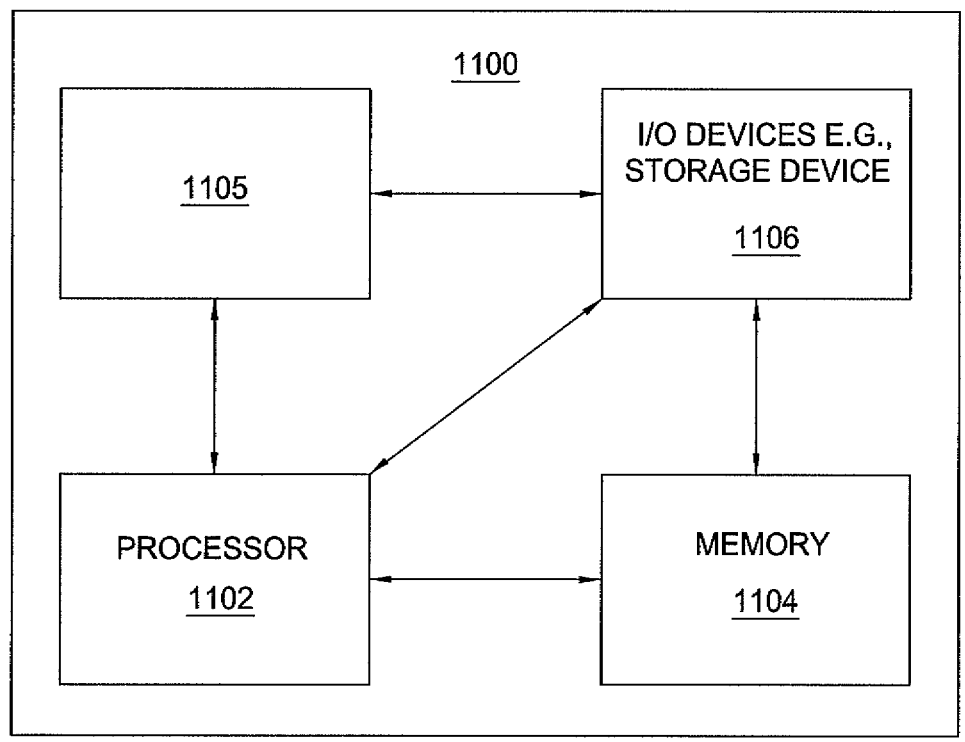
FIG. 11 depicts a high-level block diagram of a computer suitable for use in performing the functions described herein.

FIG. 11 depicts a high-level block diagram of a computer suitable for use in performing functions described herein.

As depicted in FIG. 11, computer 1100 includes a processor element 1102 (e.g., a central processing unit (CPU) and/or any other suitable processor(s)), a memory 1104 (e.g., random access memory (RAM), read only memory (ROM), and the like), a cooperating module/process 1105, and various input/output devices 1106 (e.g., a user input device (such as a keyboard, a keypad, a mouse, and the like), a user output device (such as a display, a speaker, and the like), an input port, an output port, a receiver, a transmitter, and storage devices (e.g., a tape drive, a floppy drive, a hard disk drive, a compact disk drive, and the like)).

It will be appreciated that functions depicted and described herein may be implemented in software and/or hardware, e.g., using a general purpose computer, one or more application specific integrated circuits (ASIC), and/or any other hardware equivalents. In one embodiment, the cooperating process 1105 can be loaded into memory 1104 and executed by processor 1102 to implement functions as discussed herein. Thus, cooperating process 1105 (including associated data structures) can be stored on a computer readable storage medium, e.g., RAM memory, magnetic or optical drive or diskette, and the like.

It will be appreciated that computer 1100 depicted in FIG. 11 provides a general architecture and functionality suitable for implementing functional elements described herein and/or portions of functional elements described herein. For example, the computer 1100 provides a general architecture and functionality suitable for implementing one or more of testing system 110, system under test 120, remote systems configured for performing validation and/or authentication functions for use in generating control signals as discussed herein, and the like.

It is contemplated that some of the steps discussed herein as software methods may be implemented within hardware, for example, as circuitry that cooperates with the processor to perform various method steps. Portions of the functions/elements described herein may be implemented as a computer program product wherein computer instructions, when processed by a computer, adapt the operation of the computer such that the methods and/or techniques described herein are invoked or otherwise provided. Instructions for invoking the inventive methods may be stored in fixed or removable media, transmitted via a data stream in a broadcast or other signal bearing medium, and/or stored within a memory within a computing device operating according to the instructions.

Although various embodiments which incorporate the teachings of the present invention have been shown and described in detail herein, those skilled in the art can readily devise many other varied embodiments that still incorporate these teachings.

What is claimed is:

1. An apparatus, comprising:
 a Test Access Port (TAP) comprising a Test Data Input (TDI) interface and a Test Data Output (TDO) interface; and
 a scan chain communicatively connected to the TAP, the scan chain comprising a plurality of cells communicatively connected between the TDI interface of the TAP and the TDO interface of the TAP;
 wherein one of the cells is configured to:
  receive a first control signal via the scan chain and create an open-circuit condition in the scan chain in response to the first control signal; and
  receive a second control signal via a signaling path that is different than the scan chain and remove the open-circuit condition from the scan chain in response to the second control signal.

2. The apparatus of claim 1, wherein the first control signal comprises a value from a scan register of the scan chain.

3. The apparatus of claim 1, wherein the scan chain is a first scan chain, wherein the signaling path comprises at least a portion of a second scan chain.

4. The apparatus of claim 1, wherein the one of the cells is configured to receive the second control signal from a key checker function.

5. The apparatus of claim 1, further comprising:
 a key checker function configured to:
  validate a security key; and
  generate the second control signal based on validation of the security key.

6. The apparatus of claim 5, wherein the key checker function is configured to read the security key from a portion of the scan chain.

7. The apparatus of claim 6, wherein the portion of the scan chain comprises a portion of the scan chain that is between the TDI interface of the TAP and the one of the cells.

8. The apparatus of claim 5, wherein the key checker function is configured to read the security key from a buffer associated with the key checker function.

9. The apparatus of claim 8, wherein the buffer is configured to receive the security key from:
 a portion of the scan chain that is between the TDI interface of the TAP and the one of the cells; or
 a second scan chain.

10. The apparatus of claim 1, wherein the one of the cells is configured to receive the second control signal from an authentication component in response to satisfaction of a challenge-based authentication.

11. The apparatus of claim 1, wherein the one of the cells is configured to propagate an indication that the one of the cells is active toward an authentication component configured to perform a challenge-based authentication for generating the second control signal.

12. The apparatus of claim 1, further comprising:
 an authentication component configured to:
  generate a challenge value;
  propagate the challenge value toward an answer component configured to generate an answer value based on the challenge value;
  receive the answer value from the answer component; and
  generate the second control signal in response to a determination that the answer value is valid for the challenge value.

13. The apparatus of claim 12, wherein the authentication component is configured to propagate the challenge value toward the answer component by writing the challenge value into a portion of the scan chain between the one of the cells and the TDO interface of the TAP.

14. The apparatus of claim 12, wherein the authentication component is configured to receive the answer value from the answer component by reading the answer value from a portion of the scan chain between the TDI interface of the TAP and the one of the cells.

15. A method, comprising:
 receiving a first control signal at one of a plurality of cells of a scan chain, wherein the scan chain is communicatively connected to a Test Access Port (TAP) comprising a Test Data Input (TDI) interface and a Test Data Output (TDO) interface, wherein the plurality of cells of the scan chain are communicatively connected between the TDI interface of the TAP and the TDO interface of the TAP, wherein the first control signal is received at the one of the cells via the scan chain;
 creating an open-circuit condition in the scan chain in response to the first control signal;
 receiving a second control signal at the one of the plurality of cells of the scan chain, wherein the second control signal is received via a signaling path that is different than the scan chain; and
 removing the open-circuit condition from the scan chain in response to the second control signal.

16. The apparatus of claim 1, further comprising:
a processor configured to generate the second control signal based on an authentication process.

17. The apparatus of claim 16, wherein the processor is configured to be accessed remotely via a network connection.

18. The apparatus of claim 16, wherein the processor is configured to generate the first control signal.

19. The apparatus of claim 1, wherein the one of the plurality of cells comprises:
- a control multiplexer comprising a first input interface connected to an output of a previous cell in the scan chain, a second input interface connected to an open circuit, an output interface, and a control interface;
- a first multiplexer comprising a first input interface, a second input interface connected to the output interface of the control multiplexer, an output interface, and a control interface;
- a first register comprising an input interface connected to the output interface of the first multiplexer and an output interface connected to the first input interface of the first multiplexer and connected to an input interface of a next cell in the scan chain;
- a second multiplexer comprising a first input interface, a second input interface connected to the output interface of the first register, an output interface, and a control interface; and
- a second register comprising an input interface connected to the output interface of the second multiplexer, an output interface connected to the first input interface of the second multiplexer and connected to the control interface of the control multiplexer, and a control interface connected to the signaling path.

20. The apparatus of claim 1, wherein the one of the plurality of cells comprises:
- a multiplexer comprising a first input interface connected to an output of a previous cell in the scan chain, a second input interface connected to an open circuit, an output interface, and a control interface; and
- a register comprising an output interface connected to the control interface of the multiplexer and a control interface connected to the signaling path.

* * * * *